US007075368B2

(12) United States Patent
Lin et al.

(10) Patent No.: US 7,075,368 B2
(45) Date of Patent: *Jul. 11, 2006

(54) LINEAR-IN-DECIBEL VARIABLE GAIN AMPLIFIER

(75) Inventors: Ying-Yao Lin, Chiao-Hsi Hsiang (TW); Tung-Ming Su, Kao-Hsiung Hsien (TW); Chao-Cheng Lee, Hsin-Chu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/709,198

(22) Filed: Apr. 20, 2004

(65) Prior Publication Data

US 2005/0046479 A1    Mar. 3, 2005

Related U.S. Application Data

(63) Continuation-in-part of application No. 10/708,202, filed on Feb. 16, 2004.

(30) Foreign Application Priority Data

Sep. 1, 2003    (TW) .............................. 92124135 A

(51) Int. Cl.
*H03F 3/45*    (2006.01)

(52) U.S. Cl. ...................................... 330/254; 330/256

(58) Field of Classification Search ................ 330/254, 330/256, 260, 250
See application file for complete search history.

(56) References Cited

U.S. PATENT DOCUMENTS

| | | | | |
|---|---|---|---|---|
| 5,030,924 A | * | 7/1991 | Fritz | 330/256 |
| 5,162,678 A | * | 11/1992 | Yamasaki | 327/331 |
| 5,247,398 A | * | 9/1993 | Sidman | 360/75 |
| 5,572,166 A | | 11/1996 | Gilbert | |
| 5,684,431 A | | 11/1997 | Gilbert et al. | |
| 5,900,781 A | * | 5/1999 | Igarashi et al. | 330/254 |
| 5,912,589 A | | 6/1999 | Khoury et al. | |
| 6,020,786 A | * | 2/2000 | Ashby | 330/256 |
| 6,124,761 A | * | 9/2000 | Robinson et al. | 330/254 |
| 6,292,059 B1 | | 9/2001 | Ao et al. | |
| 6,509,798 B1 | | 1/2003 | Kuroda | |
| 6,525,606 B1 | | 2/2003 | Atkinson | |
| 6,724,235 B1 | * | 4/2004 | Costa et al. | 327/378 |
| 6,791,413 B1 | * | 9/2004 | Komurasaki et al. | 330/254 |
| 6,819,183 B1 | | 11/2004 | Zhou et al. | |
| 6,882,185 B1 | * | 4/2005 | Walker et al. | 327/103 |
| 6,894,564 B1 | * | 5/2005 | Gilbert | 330/254 |
| 2001/0006353 A1 | | 7/2001 | Setty | |
| 2003/0058047 A1 | | 3/2003 | Sakurai | |
| 2003/0107438 A1 | * | 6/2003 | Kimura | 330/254 |
| 2003/0169090 A1 | * | 9/2003 | Filoramo et al. | 327/359 |
| 2005/0068087 A1 | * | 3/2005 | Kanou | 327/346 |
| 2005/0184805 A1 | | 8/2005 | Murakami | |

* cited by examiner

*Primary Examiner*—Linh V. Nguyen
(74) *Attorney, Agent, or Firm*—Winston Hsu

(57) ABSTRACT

A variable gain amplifier having a linear decibel-scale gain comprises an amplifying stage for generating an output voltage according to a differential input voltage, and a gain-controlling stage for outputting a gain-controlling voltage to the amplifying stage according to a first controlling voltage and a second controlling voltage. A voltage gain of the variable gain amplifier is inversely proportional to a simple exponential function, and the value of the simple exponential function is determined by the difference between the first controlling voltage and the second controlling voltage.

26 Claims, 6 Drawing Sheets

US 7,075,368 B2

LINEAR-IN-DECIBEL VARIABLE GAIN AMPLIFIER

CROSS REFERENCE TO RELATED APPLICATIONS

This application is a continuation-in-part of application of U.S. Ser. No. 10/708,202 filed on Feb. 16, 2004, which is still pending.

BACKGROUND OF INVENTION

1. Field of the Invention

The invention relates to a variable gain amplifier, and more particularly, to a variable gain amplifier having a linear decibel-scale gain with respect to controlling voltage(s).

2. Description of the Prior Art

Wireless communication system development continues to rapidly progress. As a result, many kinds of high bandwidth high sensitivity transceivers have been proposed. Variable gain amplifiers are often used in this kind of transceiver to broaden the processing range of the system. A variable gain amplifier having a linear gain in the decibel (dB) scale with respect to the controlling voltage(s) has the broadest gain range.

Please refer to FIG. 1, where a circuit diagram of a conventional variable gain amplifier is illustrated. The variable gain amplifier shown in FIG. 1 is a differential amplifier. The voltage gain Av of the whole circuit can be determined from the half circuit of the differential amplifier. Disregarding the phase, the voltage gain Av of this variable gain amplifier is:

$$Av = \frac{Vout'}{Vin'} = \frac{K}{1 + \exp\left(\frac{Vy}{Vt}\right)} \quad (1)$$

where K is substantially a constant value.

From equation (1) it can be seen that the denominator of the voltage gain Av is not a simple exponential function that it has a constant term "1" in addition to the simple exponential function exp(Vy/Vt). Consequently, the voltage gain Av does not have a simple exponential relationship with the controlling voltage Vy.

Please refer to FIG. 2. FIG. 2 is a graph showing the relationship between the voltage gain Av and the controlling voltage Vy of FIG. 1. Note that when Vy<Vt, the voltage gain Av will not change exponentially with respect to the change in the controlling voltage Vy. The smaller the controlling voltage Vy is, the less the voltage gain Av will change with respect to the change in the controlling voltage Vy. The area where the voltage gain Av does not have perfect exponential relationship with the controlling voltage Vy is caused by the constant term 1 in the denominator of equation 1.

SUMMARY OF INVENTION

It is therefore one of the objects of the claimed invention to provide a variable gain amplifier having an amplifying stage and a gain controlling stage to solve the above mentioned problem.

According to the claimed invention, a variable gain amplifier comprising: an amplifying stage and a gain controlling stage. The amplifying stage is for generating an output voltage according to a differential input voltage. The gain controlling stage is for adjusting a voltage gain of the amplifying stage according to a first controlling voltage and a second controlling voltage.

It is an advantage of the claimed invention that the voltage gain is inversely proportional to a simple exponential function, and the value of the simple exponential function is determined by the difference between the first and the second controlling voltages.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
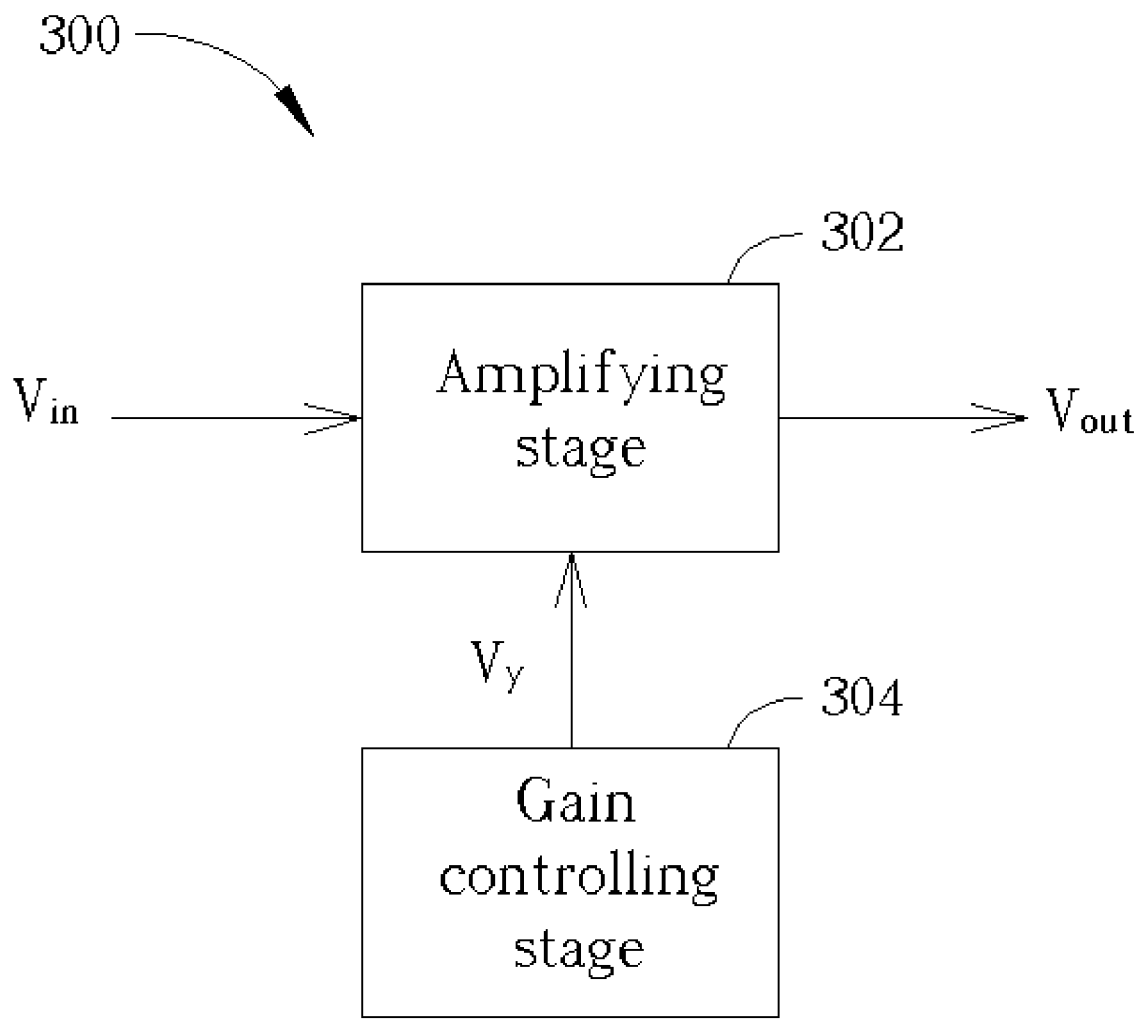
FIG. 3 is a diagram of a variable gain amplifier according to the present invention.

Please refer to FIG. 3 showing a schematic diagram of a variable gain amplifier according to the embodiment of the present invention. The variable gain amplifier 300 comprises an amplifying stage 302 for generating an output voltage Vout according to an input voltage Vin and a gain controlling voltage $V_y$. A voltage gain, i.e. the ratio between the output voltage Vout and the input voltage Vin, is determined by the gain controlling voltage $V_y$. A gain controlling stage 304 is for generating the gain controlling voltage Vy.

Figure 1:
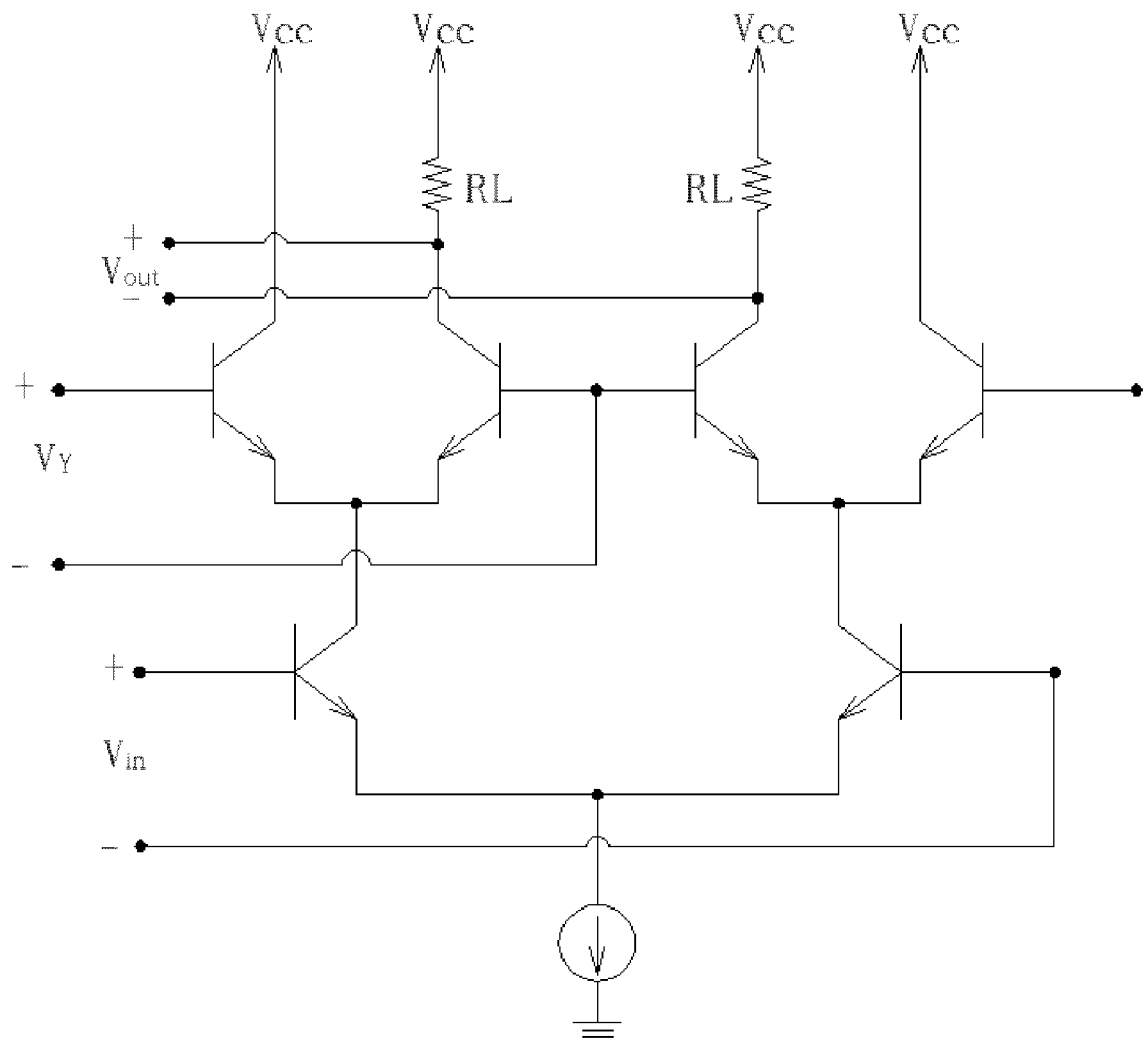
FIG. 1 is a circuit diagram of a variable gain amplifier of the prior art.

In this embodiment, the amplifying stage 302 is the same as the variable gain amplifier shown in FIG. 1. Concerning the amplifying stage 302 please refer to FIG. 1 and the above description describing the variable gain amplifier shown in FIG. 1. Referring to equation 1, it can be seen that the value of the voltage gain of the amplifying stage 302 is determined by the gain controlling voltage Vy.

Figure 4:
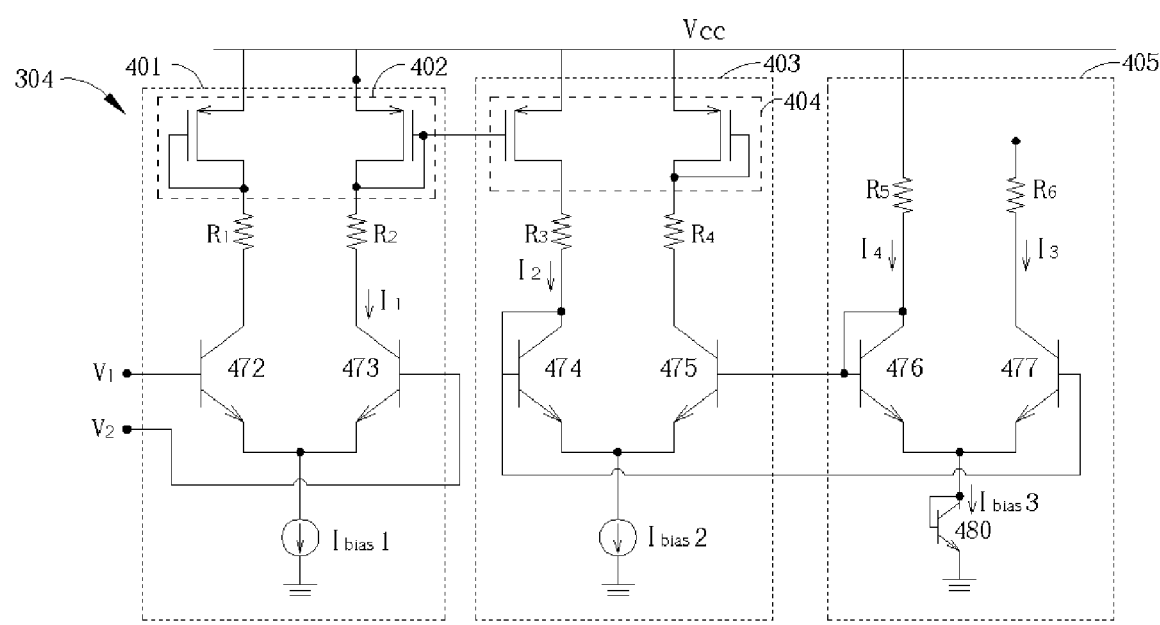
FIG. 4 and FIG. 5 are circuit diagrams of the gain controlling stage 304 according to present invention.
Figure 5:
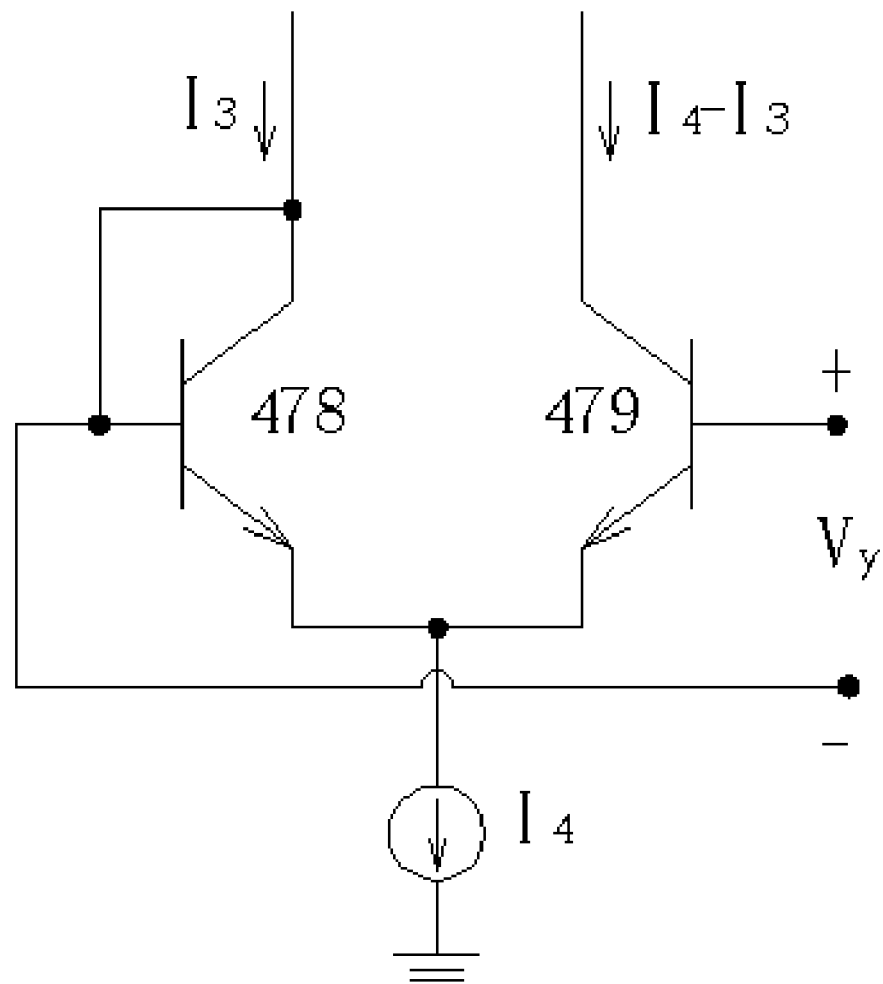

Next, please refer to FIG. 4 and FIG. 5, where circuit diagrams of the gain controlling stage 304 according to the embodiment of the present invention are illustrated. The gain controlling stage 304 is for determining the value of the gain controlling voltage Vy output to the amplifying stage 302 according to the first controlling voltage V1 and the second controlling voltage V2. In this embodiment, the gain controlling stage 304 comprises a transconductance unit 401, a first current transforming unit 403, a second current transforming unit 405 (as shown in FIG. 4), and an outputting unit 407 (as shown in FIG. 5).

The transconductance unit 401 comprises a first transistor 472 coupled to the first controlling voltage V1, a second transistor 473 coupled to the second controlling voltage V2, a first bias current source Ibias1 coupled to the emitter of the first transistor 472 and the emitter of the second transistor 473 for providing a first bias current Ibias1, a first current source 402, a first resistor R1 coupled between the collector of the first transistor 472 and the first current source 402, and a second resistor R2 coupled between the collector of the second transistor 473 and the first current source 402.

The value of the first current I1 flowing through the collector of the second transistor 473 is determined by the first bias current Ibias1 and the difference between the first controlling voltage V1 and the second controlling voltage V2. In this embodiment, the relationship is as follows:

$$I1 = Ibias1 \bigg/ \left[1 + \exp\left(\frac{V1 - V2}{Vt}\right)\right] \quad (2)$$

Because the transconductance unit 401 is a differential circuit, the collector current of the first transistor 472 is determined by the first controlling voltage V1, the second controlling voltage V2 and the first bias current Ibias1. The relationship is similar to that shown in equation 2.

The first current transforming unit 403 is coupled to the transconductance unit 401 through the second current source 404. The first current transforming unit 403 comprises a third transistor 474 having the collector and the base being coupled together, a fourth transistor 475, a second bias current source Ibias2 coupled to the emitter of the third transistor 474 and the emitter of the fourth transistor 475 for providing a second bias current Ibias2, a second current source 404, a third resistor R3 coupled between the collector of the third transistor 474 and the second current source 404, and a fourth resistor R4 coupled between the collector of the fourth transistor 475 and the second current source 404. The second current source 404 and the first current source 402 form a current mirror circuit. And in this embodiment the ratio between the collector current I2 of the third transistor 474 and the collector current I1 of the second transistor 473 is the same as the ratio between the first bias current Ibias1 and the second bias current Ibias2, as follows:

$$I2/I1 = Ibias2/Ibias1 \quad (3)$$

Because the first current transforming unit 403 is also a differential circuit, according to the currents relationship shown in equation 3, the ratio between the collector current of the fourth transistor 475 and the collector current I2 of the third transistor 474 is the same as the ratio between the collector current of the first transistor 472 and the collector current I1 of the second transistor 473. In this embodiment, when the first bias current Ibias1 equals the second bias current Ibias2, the collector current of the first transistor 472 will also be equal to the collector current of the fourth transistor 475, and the collector current I1 of the second transistor will be equal the collector current I2 of the third transistor.

The second current transforming unit 405 comprises a fifth transistor 476 having the base and the collector coupled to the base of the fourth transistor 475, a sixth transistor 477 having the base coupled to the base and the collector of the third transistor 474, and a ninth transistor 480 coupled to the emitter of the fifth transistor 476 and the emitter of the sixth transistor 477 for providing a third bias current Ibias3. By way of the loop formed with the third transistor 474, the fourth transistor 475, the fifth transistor 476, and the sixth transistor 477, the ratio between the collector current I3 of the sixth transistor 476 and the collector current I2 of the third transistor 474 is the same as the ratio between the third Ibias2 and the first bias current Ibias1. This is shown in the following equation:

$$I3/I2 = Ibias3/Ibias2 \quad (4)$$

The second current transforming unit 405 is also a differential circuit. As shown in the relationship between the collector current I2 of the third transistor 474 and the collector current I3 of the sixth transistor 477 shown in equation 4, the ratio between the collector current I4 of the fifth transistor 476 and the collector current I3 of the sixth transistor 477 is the same as the ratio between the collector current of the fourth transistor 475 and the collector current I2 of the third transistor 474.

Hence, according to equations 2, 3, 4, and the relationship between I4 and I3 described above, the circuit shown in FIG. 4 is a voltage controlled current amplifier. By way of changing the value of the differential input voltage, i.e. the difference between the first controlling voltage V1 and the second controlling voltage V2, the relationship between the output currents I3 and I4 can be controlled. The relationship is as follows:

$$\frac{I4}{I3} = K \cdot \exp\left(\frac{V1 - V2}{Vt}\right) \quad (5)$$

The outputting unit 407 shown in FIG. 5 comprises a seventh transistor 478 having the base and the collector being coupled together, an eighth transistor 479, and a fourth bias current source I4 coupled to the emitter of the seventh transistor 478 and the emitter of the eighth transistor 479. Please note that the voltage controlled current amplifier shown in FIG. 4 is coupled to the outputting unit 407 shown in FIG. 5 through at least a current mirror device (not shown), such that the bias current output by the fourth bias current source is substantially the same as the collector current I4 of the fifth transistor 476, and the collector current I3 of the sixth transistor 477 is substantially the same as the collector current I3 of the seventh transistor 478. Although the current mirrors are not shown, a person skilled in the art can easily design such the at least one current mirror. At this point, the collector current of the seventh transistor 478 will be equal to the collector current I3 of the sixth transistor 477, and the collector current of the eighth transistor 479 will be equal to difference between the collector current I4 of the fifth transistor 476 and the collector current I3 of the sixth transistor 477. The base of the seventh transistor 478 and the base of the eighth transistor 479 are for coupling to the amplifying stage 302 and outputting the gain controlling voltage Vy. Hence, the relationship of the gain controlling voltage Vy, the collector current I3 of the seventh transistor 478 and the collector current (I4−I3) of the eighth transistor 479 is follows:

$$Vy = Vt \cdot \ln\left(\frac{I4 - I3}{I3}\right) = Vt \cdot \ln\left(\frac{I4}{I3} - 1\right) \quad (6)$$

Accordingly, the gain controlling stage 304 is for determining the current relation in each stage of the differential circuit according to the difference between the first controlling voltage V1 and the second controlling voltage V2, and for determining the value of the gain controlling voltage Vy according to these current relations. Consequentially, the relationship between the gain controlling voltage Vy, the first controlling voltage V1 and the second controlling voltage V2 is as follows:

$$Vy = Vt \cdot \ln\left[K \cdot \exp\left(\frac{V1-V2}{Vt}\right) - 1\right] \quad (7)$$

Using the gain controlling voltage Vy output by the gain controlling stage 304 as the controlling voltage Vy of the amplifying stage 302 shown in FIG. 1, the voltage gain of the amplifying stage 302, i.e. the ratio between the output voltage Vout and the input voltage Vin, is as follows:

$$Av = \frac{Vout}{Vin} = \frac{K1}{\exp[K2(V1-V2)]} \quad (8)$$

where K1 relates to the output resistance RL of the amplifying stage 302, and K2 relates to the thermal voltage Vt of bipolar junction transistors. In this embodiment, both K1 and K2 are constants.

Please note that the above-mentioned gain controlling stage 304 is only an embodiment example and the present invention is not constrained by this embodiment. Any circuit that can generate a gain controlling voltage Vy which is proportional to ln(Ia/Ib−K3) can be used to be one of the embodiments of the present invention. In this formula, K3 is a constant, Ia corresponds to the first controlling voltage V1, and Ib corresponds to the second controlling voltage V2.

Figure 2:
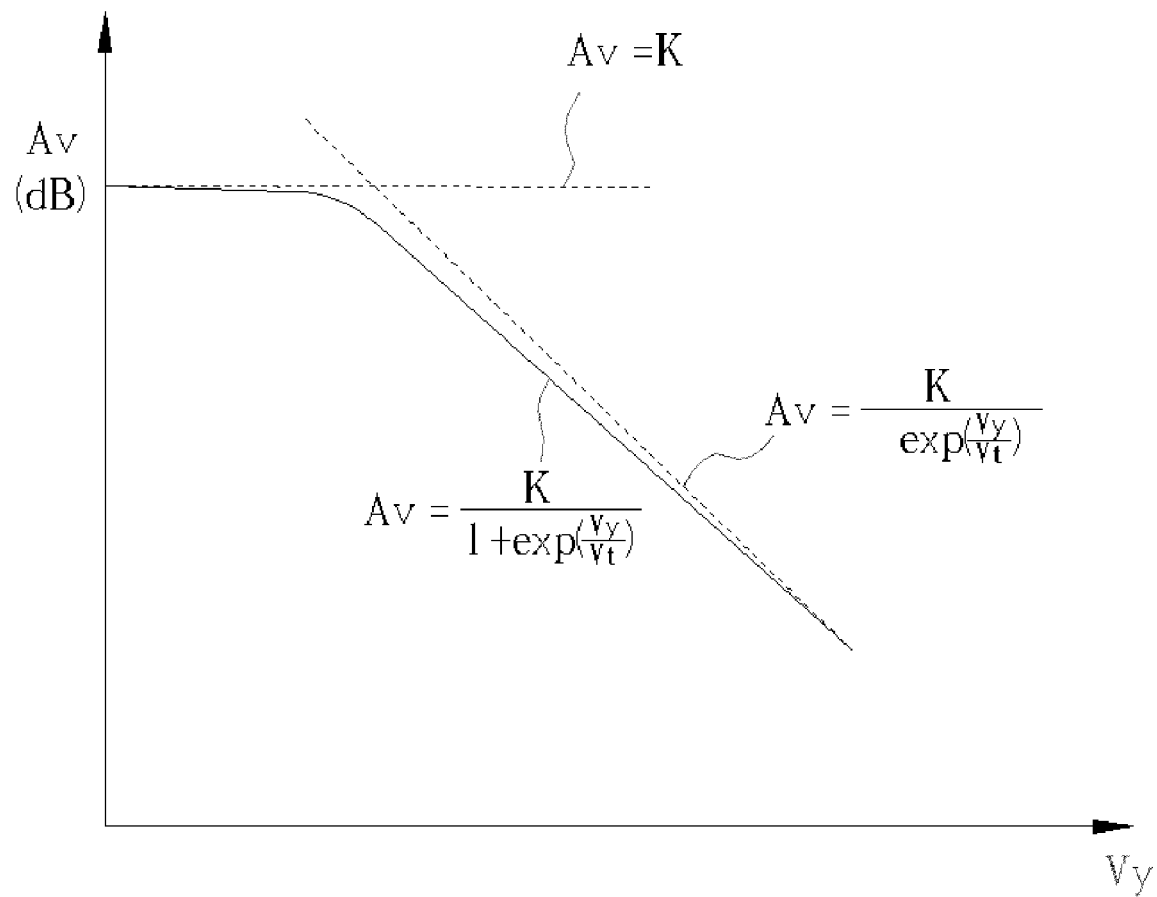
FIG. 2 is a graph showing the relationship between the voltage gain Av and the controlling voltage Vy of FIG. 1.
Figure 6:
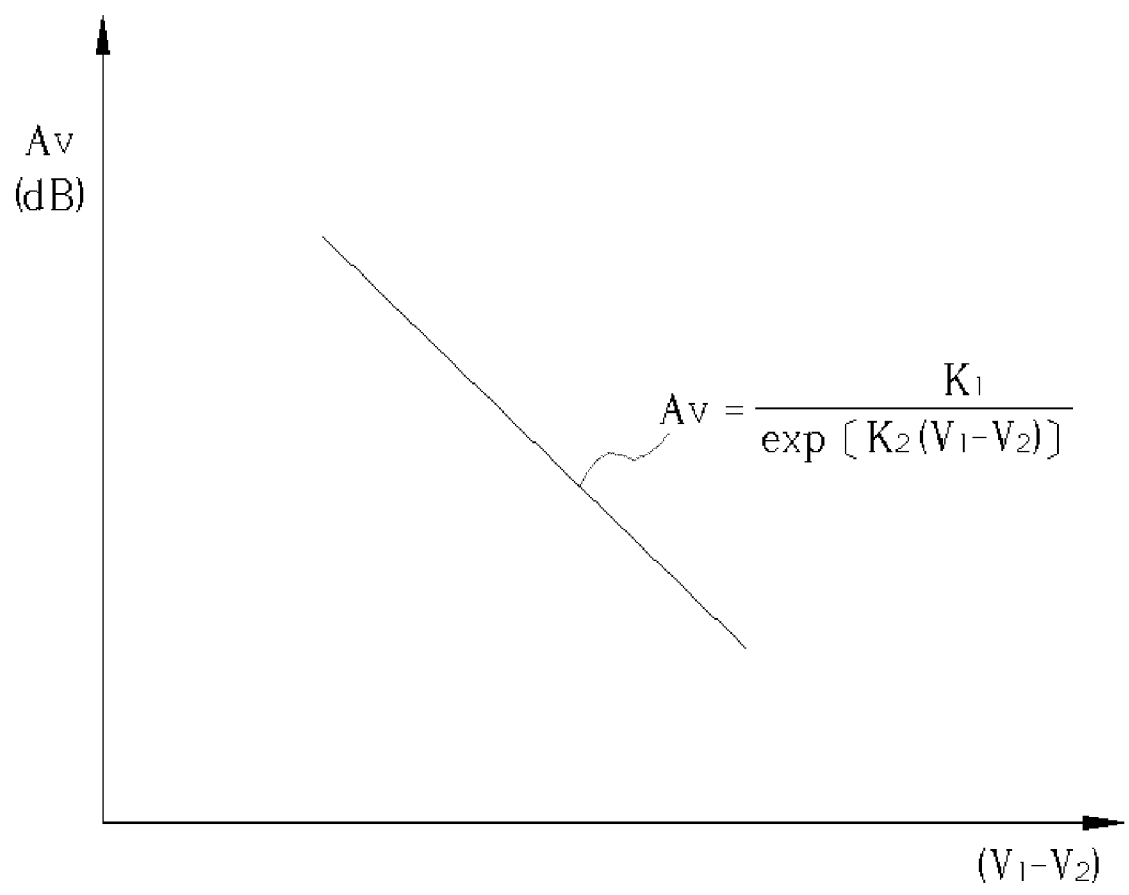
FIG. 6 is a graph for showing the relation between the voltage gain Av and the difference between the first and the second controlling voltages according to equation 8.

It can be seen from equation 8 that through the gain controlling stage 304, the relationship between the voltage gain Av of the amplifying stage 302 and the difference between the first controlling voltage V1 and the second controlling voltage is a simple exponential function K1/exp[K2(V1−V2)]. Please refer to FIG. 6. FIG. 6 is a graph showing the relationship between the voltage gain Av and the difference between the first and the second controlling voltages according to equation 8. Compare FIG. 6 to the graph shown in FIG. 2 and it can be seen that in FIG. 6 the voltage gain Av has a simple exponential relationship with the difference between the first controlling voltage V1 and the second controlling voltage V2. That is, the denominator of the voltage gain Av is a simple exponential function, which can be expressed in the form of exp(V1−V2). Therefore, the voltage gain Av has a simple exponential relationship with the controlling voltage Vy, which is determined by the difference of the first and the second controlling voltage (V1−V2). In addition, in this embodiment, the variable gain amplifier has two input ends for receiving differential input voltage, however, the variable gain amplifier of the present invention can also be single ended in addition to the differential configuration for generating a differential output voltage.

Of course, the amplifying stage used in the present invention does not necessary need to be the same as that shown in FIG. 1. Any amplifying circuit having a voltage gain with a denominator combined by a constant term and a simple exponential function term as the amplifying circuit shown in FIG. 1 can be used in the present invention.

Those skilled in the art will readily observe that numerous modification and alternation of the device may be made while retaining the teaching of the invention. Accordingly, the above disclosure should be construed as limited only by the metes and bounds of the appended claims.

The invention claimed is:

1. A variable gain amplifier, comprising:
   an amplifying stage for generating an output voltage according to a differential input voltage; and
   a gain controlling stage for outputting a gain controlling voltage to determine a voltage gain of the amplifying stage according to a first controlling voltage and a second controlling voltage, such that the voltage gain is inversely proportional to a simple exponential function, the value of the simple exponential function being determined by the difference between the first controlling voltage and the second controlling voltage;
   wherein the gain controlling stage comprises:
      a transconductance unit for generating a first current and a second current according to the first controlling voltage and the second controlling voltage; and an outputting unit for generating the gain controlling voltage according to the first current and the second current.

2. The variable gain amplifier of claim 1, wherein the denominator of the voltage gain of the amplifying stage is expressed as (K1+exp(K2×Vy)), both K1 and K2 are substantially constants, and Vy is the gain controlling voltage.

3. The variable gain amplifier of claim 1, wherein the gain controlling voltage is expressed in the form of the difference of the first and the second controlling voltages.

4. The variable gain amplifier of claim 1, wherein the gain controlling stage comprises:
   the transconductance unit for generating the first current and the second current according to the first controlling voltage and the second controlling voltage, wherein the ratio between the first current and the second current is determined by the difference between the first controlling voltage and the second controlling voltage;
   a current transforming unit coupled to the transconductance unit for generating a third current corresponding to the first current, and a fourth current corresponding to the second current; and
   the outputting unit coupled to the current transforming unit for generating the gain controlling voltage according to the third current and the fourth current;
   wherein the value of the gain controlling voltage is determined by the difference between the first controlling voltage and the second controlling voltage.

5. The variable gain amplifier of claim 4, wherein the value of the third current is substantially the same as that of the first current, and the value of the fourth current is substantially the same as that of the second current.

6. The variable gain amplifier of claim 4, wherein the outputting unit comprises:
   a third transistor, wherein the current of the third transistor corresponds to the fourth current;
   a fourth transistor; and
   a second bias current source coupled to the third transistor and the fourth transistor for providing a second bias current, wherein the second bias current corresponds to the third current;
   wherein the third transistor and the fourth transistor are for outputting the gain controlling voltage.

7. The variable gain amplifier of claim 6, wherein the value of the second bias current is substantially the same as the value of the third current, and the value of the current of the third transistor is substantially the same as the value of the fourth current.

8. The variable gain amplifier of claim 4, wherein the current transforming unit comprises:
a first current transforming unit, comprising:
a fifth transistor having a first end being coupled to a second end;
a sixth transistor,
a third bias current source coupled to a third end of the fifth transistor and the sixth transistor for providing a third bias current; and
a fourth current source coupled to the fifth transistor and the transconductance unit; and
a second current transforming unit comprising:
a seventh transistor having a first end and a second end being coupled to the sixth transistor for outputting the third current;
an eighth transistor coupled to the fifth transistor for outputting the fourth current; and
a fourth bias current source coupled to the seventh transistor and the eighth transistor for providing a fourth bias current.

9. The variable gain amplifier of claim 1, wherein the relationship between the first current, the second current, the first controlling voltage, and the second controlling voltage is: $I1/I2 = \exp(K \times (V1-V2))$; where I1 is the first current, I2 is the second current, V1 is the first controlling voltage, and V2 is the second controlling voltage.

10. The variable gain amplifier of claim 1, wherein the gain controlling voltage is proportional to $\ln(I1/I2-K3)$ and I1, I2, and K3 are respectively the first current, the second current, and a constant.

11. The variable gain amplifier of claim 1, wherein the transconductance unit comprises:
a first transistor coupled to the first controlling voltage;
a second transistor coupled to the second controlling voltage; and
a first bias current source coupled to the first transistor and the second transistor for providing a first bias current;
wherein the first transistor outputs the first current according to the first controlling voltage and the first bias current, and the second transistor outputs the second current according to the second controlling voltage and the first bias current.

12. The variable gain amplifier of claim 1, further comprising a current mirror circuit.

13. The variable gain amplifier of claim 1, wherein the amplifying stage is coupled to the gain controlling stage by using a current mirror structure.

14. The variable gain amplifier of claim 1, wherein the ratio between the first current and the second is determined by the difference between the first controlling voltage and the second controlling voltage.

15. A variable gain amplifier, comprising:
an amplifying stage for generating an output voltage according to an input voltage; and
a gain controlling stage for outputting a gain controlling voltage to determine a voltage gain of the amplifying stage according to a first controlling voltage V1 and a second controlling voltage V2, such that the voltage gain changes linearly in decibel in response to the subtraction between the first controlling voltage and the second controlling voltage;
wherein the gain controlling voltage is proportional to a logarithmic function, and the voltage gain increases while the gain controlling voltage decreases;
wherein the variable gain amplifier further comprises a current mirror structure.

16. The variable gain amplifier of claim 15, wherein the voltage gain is inversely proportional to an equation expressed as $k1 \times \exp[k2(V1-V2)]$, in which both k1 and k2 are substantial constants.

17. The variable gain amplifier of claim 15, wherein the gain controlling stage comprises:
a transconductance unit for generating a first current and a second current according to the first controlling voltage and the second controlling voltage, wherein the ratio between the first current and the second current is determined by the difference between the first controlling voltage and the second controlling voltage;
a current transforming unit coupled to the transconductance unit for generating a third current corresponding to the first current, and a fourth current corresponding to the second current; and
an outputting unit coupled to the current transforming unit for generating the gain controlling voltage according to the third current and the fourth current;
wherein the value of the gain controlling voltage is determined by the difference between the first controlling voltage and the second controlling voltage.

18. The variable gain amplifier of claim 17, wherein the relationship between the first current, the second current, the first controlling voltage, and the second controlling voltage is: $I1/I2 = \exp(K \times (V1-V2))$; where I1 is the first current, I2 is the second current, K is a substantial constant, V1 is the first controlling voltage, and V2 is the second controlling voltage.

19. The variable gain amplifier of claim 18, wherein the gain controlling voltage is proportional to $\ln(I1/I2-K3)$ and K3 is a constant.

20. The variable gain amplifier of claim 17, wherein the value of the third current is substantially the same as that of the first current, and the value of the fourth current is substantially the same as that of the second current.

21. The variable gain amplifier of claim 17, wherein the transconductance unit comprises:
a first transistor coupled to the first controlling voltage;
a second transistor coupled to the second controlling voltage; and
a first bias current source coupled to the first transistor and the second transistor for providing a first bias current;
wherein the first transistor outputs the first current according to the first controlling voltage and the first bias current, and the second transistor outputs the second current according to the second controlling voltage and the first bias current.

22. The variable gain amplifier of claim 17, wherein the outputting unit comprises:
a third transistor, wherein the current of the third transistor corresponds to the fourth current;
a fourth transistor; and
a second bias current source coupled to the third transistor and the fourth transistor for providing a second bias current, wherein the second bias current corresponds to the third current;
wherein the third transistor and the fourth transistor are for outputting the gain controlling voltage.

23. The variable gain amplifier of claim 22, wherein the value of the second bias current is substantially the same as the value of the third current, and the value of the current of the third transistor is substantially the same as the value of the fourth current.

24. The variable gain amplifier of claim 17, wherein the current transforming unit comprises a current mirror circuit.

25. The variable gain amplifier of claim 17, wherein the current transforming unit comprises:
   a first current transforming unit, comprising:
      a fifth transistor having a first end being coupled to a second end;
      a sixth transistor;
      a third bias current source coupled to a third end of the fifth transistor and the sixth transistor for providing a third bias current; and
      a fourth current source coupled to the fifth transistor and the transconductance unit; and
   a second current transforming unit comprising:
      a seventh transistor having a first end and a second end being coupled to the sixth transistor for outputting the third current;
      an eighth transistor coupled to the fifth transistor for outputting the fourth current; and
      a fourth bias current source coupled to the seventh transistor and the eighth transistor for providing a fourth bias current.

26. The variable gain amplifier of claim 15, wherein the amplifying stage is coupled to the gain controlling stage by using the current mirror structure.

* * * * *